(12) United States Patent
Sheng et al.

(10) Patent No.: US 7,595,652 B2
(45) Date of Patent: *Sep. 29, 2009

(54) SYSTEM AND METHOD FOR REDUCING HEAT DISSIPATION DURING BURN-IN

(76) Inventors: Eric Chen-Li Sheng, 144 S. 3$^{rd}$ St., #531, San Jose, CA (US) 95112; David H. Hoffman, 998 Tulip Ct., Sunnyvale, CA (US) 94086; John Laurence Niven, 1364 Arlington Rd., Livermore, CA (US) 94551

( * ) Notice: Subject to any disclaimer, the term of this patent is extended or adjusted under 35 U.S.C. 154(b) by 0 days.

This patent is subject to a terminal disclaimer.

(21) Appl. No.: 11/827,290

(22) Filed: Jul. 10, 2007

(65) Prior Publication Data

US 2008/0024152 A1      Jan. 31, 2008

Related U.S. Application Data

(63) Continuation of application No. 11/136,038, filed on May 23, 2005, now Pat. No. 7,242,205, which is a continuation of application No. 10/791,241, filed on Mar. 1, 2004, now Pat. No. 6,897,671.

(51) Int. Cl.
   *G01R 31/02* (2006.01)

(52) U.S. Cl. .................................... 324/760

(58) Field of Classification Search ............ None
   See application file for complete search history.

(56) References Cited

U.S. PATENT DOCUMENTS

| | | | |
|---|---|---|---|
| 3,244,267 A | 4/1966 | Berta | |
| 3,366,220 A | 1/1968 | Hebel | |
| 4,265,356 A | 5/1981 | Glover | |
| 4,313,720 A | 2/1982 | Spurr | |
| 4,354,813 A | 10/1982 | Collombin | |
| 4,434,583 A | 3/1984 | Burgess, Jr. | |
| 4,938,636 A | 7/1990 | Aidlin et al. | |
| 5,119,337 A | 6/1992 | Shimizu et al. | |
| 5,161,665 A | 11/1992 | Cragun | |
| 5,186,307 A | 2/1993 | Doudement et al. | |
| 5,309,090 A | 5/1994 | Lipp | |
| 5,406,212 A | 4/1995 | Hashinaga et al. | |

(Continued)

FOREIGN PATENT DOCUMENTS

EP    0252753    1/1988

(Continued)

OTHER PUBLICATIONS

Non-Final OA Dated Sep. 1, 2004; U.S. Appl. No. 10/791,241.

(Continued)

*Primary Examiner*—Jermele M Hollington

(57) ABSTRACT

A plurality of devices under test are each subject to a body bias voltage during burn-in testing. The body bias voltage reduces leakage current associated with the devices under test. A test controller can access a store of information including leakage current as a function of body bias voltage and can select a body bias voltage that corresponds to the minimum leakage current in the store of information. A voltage supply coupled to the test controller can provide the body bias voltage corresponding to the minimum leakage current to the devices under test during the burn-in testing.

10 Claims, 3 Drawing Sheets

U.S. PATENT DOCUMENTS

| | | | |
|---|---|---|---|
| 5,501,552 A | 3/1996 | Simkowski | |
| 5,607,706 A | 3/1997 | Ingram | |
| 5,701,666 A | 12/1997 | DeHaven et al. | |
| 5,772,000 A | 6/1998 | Serres | |
| 5,834,038 A | 11/1998 | Ogihara | |
| 5,844,429 A | 12/1998 | Cho | |
| 5,944,165 A | 8/1999 | Mannlein et al. | |
| 5,995,428 A | 11/1999 | Chien et al. | |
| 6,035,407 A | 3/2000 | Gebara et al. | |
| 6,037,792 A | 3/2000 | McClure | |
| 6,100,751 A | 8/2000 | De et al. | |
| 6,104,061 A | 8/2000 | Forbes et al. | |
| 6,114,866 A | 9/2000 | Matsuo et al. | |
| 6,137,301 A | 10/2000 | Chen | |
| 6,157,201 A | 12/2000 | Leung, Jr. | |
| 6,218,892 B1 | 4/2001 | Soumyanath et al. | |
| 6,262,588 B1 | 7/2001 | Chen | |
| 6,310,485 B1 | 10/2001 | McClure | |
| 6,455,336 B1 | 9/2002 | Berndlmaier et al. | |
| 6,577,148 B1 | 6/2003 | DeHaven et al. | |
| 6,620,352 B1 | 9/2003 | Davis et al. | |
| 6,897,671 B1* | 5/2005 | Sheng et al. | 324/760 |
| 6,900,650 B1* | 5/2005 | Sheng et al. | 324/760 |
| 6,956,437 B2 | 10/2005 | Lopez et al. | |
| 7,242,205 B1* | 7/2007 | Sheng et al. | 324/760 |
| 7,248,988 B2* | 7/2007 | Sheng et al. | 702/132 |
| 2002/0030533 A1 | 3/2002 | De et al. | |
| 2002/0050833 A1 | 5/2002 | Jones et al. | |
| 2002/0140496 A1 | 10/2002 | Keshavarzi et al. | |
| 2002/0186031 A1 | 12/2002 | Pelissier | |
| 2003/0001604 A1 | 1/2003 | Pullen et al. | |
| 2003/0001605 A1 | 1/2003 | Jones et al. | |
| 2003/0091681 A1 | 5/2003 | Drysdale et al. | |
| 2004/0016977 A1 | 1/2004 | Miyazaki et al. | |
| 2004/0083075 A1 | 4/2004 | Fan | |
| 2004/0108867 A1 | 6/2004 | Butler | |
| 2004/0111231 A1 | 6/2004 | Ando | |
| 2004/0140818 A1 | 7/2004 | Perner | |
| 2004/0183588 A1 | 9/2004 | Chandrakasan et al. | |
| 2005/0048159 A1 | 3/2005 | Hirasawatsu et al. | |
| 2005/0088137 A1 | 4/2005 | Cohen et al. | |
| 2005/0240844 A1 | 10/2005 | Pullen et al. | |
| 2006/0020838 A1 | 1/2006 | Tschanz et al. | |
| 2007/0271061 A1* | 11/2007 | Sheng et al. | 702/136 |

FOREIGN PATENT DOCUMENTS

| | | |
|---|---|---|
| EP | 0292126 | 11/1988 |
| EP | 0292126 A | 11/1988 |
| EP | 0292136 | 11/1988 |
| EP | 0292136 A | 11/1988 |
| WO | PCT03040740 | 5/2003 |

OTHER PUBLICATIONS

Notice of Allowance Dated Jan. 13, 2005; U.S. Appl. No. 10/791,241.
Non-Final OA Dated Sep. 1, 2004; U.S. Appl. No. 10/791,459.
Non-Final OA Dated Jan. 13, 2005; U.S. Appl. No. 10/791,459.
Non-Final OA Dated Jun. 13, 2005; U.S. Appl. No. 10/791,099.
Non-Final OA Dated Nov. 28, 2005; U.S. Appl. No. 10/791,099.
Non-Final OA Dated May 25, 2006; U.S. Appl. No. 10/791,099.
Final OA Dated Oct. 31, 2006; U.S. Appl. No. 10/791,099.
Notice of Allowance Dated Feb. 6, 2007; U.S. Appl. No. 10/791,099.
Non-Final OA Dated Jul. 18, 2005; U.S. Appl. No. 11/136,038.
Non-Final OA Dated Jan. 5, 2006; U.S. Appl. No. 11/136,038.
Final OA Dated Jun. 23, 2006; U.S. Appl. No. 11/136,038.
Notice of Allowance Dated Nov. 9, 2006; U.S. Appl. No. 11/136,038..
Notice of Allowance Dated Mar. 1, 2007; U.S. Appl. No. 11/136,038.
Non-Final OA Dated Jul. 24, 2008; U.S. Appl. No. 11/881,006.
Non-Final OA Dated Jul. 24, 2008; U.S. Appl. No. 11/881,006.
Notice of Allowance Dated Mar. 17, 2009; U.S. Appl. No. 11/881,006.

* cited by examiner

SYSTEM AND METHOD FOR REDUCING HEAT DISSIPATION DURING BURN-IN

This application is a continuation application of the U.S. Patent Application with Ser. No. 11/136,038, now U.S. Pat. No. 7,242,205, filed May 23, 2005, by Sheng et al., and entitled "System and Method for Reducing Heat Dissipation During Burn-in," which in turn is a continuation application of the U.S. Patent Application with Ser. No. 10/791,241, now U.S. Pat. No. 6,897,671, filed Mar. 1, 2004, by Sheng et al., and entitled "System and Method for Reducing Heat Dissipation During Burn-in," each of which is hereby incorporated by reference in entirety.

RELATED UNITED STATES PATENT APPLICATIONS

This Application is related to U.S. patent application Ser. No. 10/791,459, now U.S. Pat. No. 6,900,650, by E. Sheng et al., filed on Mar. 1, 2004, entitled "System and Method for Controlling Temperature During Burn-In," assigned to the assignee of the present invention, and hereby incorporated by reference in its entirety.

This Application is related to U.S. patent application Ser. No. 10/791,099, now U.S. Pat. No. 7,248,988, by E. Sheng et al., filed on Mar. 1, 2004, entitled "System and Method for Reducing Temperature Variation During Burn-in," assigned to the assignee of the present invention, and hereby incorporated by reference in its entirety.

BACKGROUND OF THE INVENTION

1. Field of the Invention

Embodiments of the present invention relate to burn-in of semiconductor devices.

2. Related Art

Semiconductor devices (e.g., microprocessors) frequently dissipate a great deal of heat, particularly when operated at elevated temperatures and voltages to screen for defects during burn-in operations. Such heat dissipation is deleterious during burn-in operations, conventionally requiring complex and expensive test chambers with very high cooling and heat sink capacities.

SUMMARY OF THE INVENTION

Therefore, a system and/or method for reducing heat dissipation during burn-in would be valuable.

Accordingly, systems and methods for reducing heat dissipation during burn-in testing are disclosed. In one embodiment, devices under test are each subject to a body bias voltage. The body bias voltage reduces leakage current associated with the devices under test. Accordingly, heat dissipation is reduced during burn-in.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Figure 1:
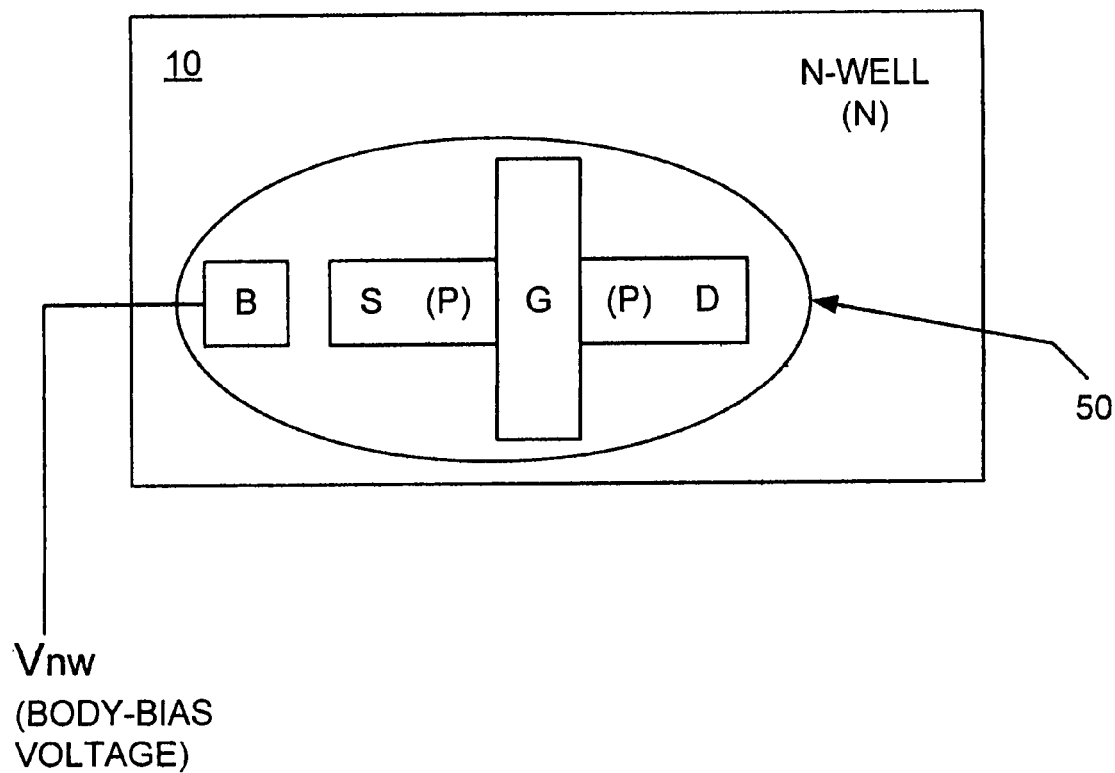
FIG. 1 illustrates a top view of a positive-channel field effect transistor (pFET) formed in an N-well in accordance with an embodiment of the present invention.

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, bytes, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "applying," "selecting," "accessing" or the like, refer to the action and processes (e.g., flowcharts 300 and 400 of FIGS. 3 and 4, respectively) of a computer system or similar intelligent electronic computing device, that manipulates and transforms data represented as physical (electronic) quantities within the computer system's registers and memories into other data similarly represented as physical quantities within the computer system memories or registers or other such information storage, transmission or display devices.

The following description of embodiments of the present invention describes coupling a body bias voltage to positive-channel field effect transistors (pFETs) or p-type metal-oxide semiconductor field effect transistors (p-type MOSFETS) formed in surface N-wells via a conductive sub-surface region of n-type doping when a p-type substrate and an N-well process are utilized. However, embodiments in accordance with the present invention are equally applicable to coupling a body bias voltage to negative-channel FETs (nFETs) or n-type MOSFETS formed in surface P-wells via a conductive sub-surface region of p-type doping when an n-type substrate and a P-well process are utilized. Consequently, embodiments in accordance with the present invention are well suited to semiconductors formed with and in either p-type or n-type materials.

FIG. 1 illustrates a top view of a pFET 50 (or p-type MOSFET) formed in an N-well 10 when a p-type substrate and an N-well process are utilized in accordance with one embodiment of the present invention. The N-well 10 has an n-type doping. Regions of a semiconductor device that are doped with an n-type dopant have one type of conductivity while regions that are doped with a p-type dopant have another type of conductivity. Typically, various dopant concentrations are utilized in different regions of the semiconductor device.

In the present embodiment, the pFET 50 has a body bias voltage Vnw applied to its bulk or body terminal B. As depicted in FIG. 1, the pFET 50 has gate G, drain D (p-type doping), source S (p-type doping), and bulk/body terminal B. In particular, the bulk/body terminal B is coupled to the N-well 10. Hence, a voltage applied to the bulk/body terminal B is received by the N-well 10. In the case of body biasing, the bulk/body terminal B receives a body bias voltage Vnw. Thus, the body bias voltage Vnw is applied to the N-well 10.

The pFET 50 is body biased to influence its performance. Without body biasing, the source S and bulk/body terminal B are coupled together. With body biasing, the source S and bulk/body terminal B are not coupled together. Body biasing enables the potential difference between the source S and bulk/body terminal B of the pFET 50 to be controlled, thereby providing the ability to control the threshold voltage level of the pFET 50. Other parameters, such as the leakage current associated with pFET 50, can also thereby be controlled. Increasing threshold voltage decreases leakage current. Thus, body biasing to increase threshold voltage can be used to decrease leakage current.

Burn-in operations to detect defects in integrated circuit are generally performed at stressing temperatures (e.g., 150 degrees Celsius), stressing voltage (e.g., 1.5 times nominal operating voltage), and at low operating frequencies (usually orders of magnitude slower than normal operating frequencies). Current consumption, particularly leakage current consumption, in most semiconductors increases with increasing operating voltage. Operating integrated circuit devices at an elevated temperature also increases current requirements. In general, current increases exponentially with respect to operating voltage and temperature.

Under burn-in test conditions, the leakage current associated with the integrated circuit is a significant contributor to the power consumed by the integrated circuit as well as the heat produced by the integrated circuit. Thus, reducing leakage current is advantageous because it will lower the power requirements for burn-in testing, and will also reduce the amount of heat dissipated by the integrated circuits being tested. Reducing the amount of heat dissipated reduces the amount of heat to be removed from the test chamber, so that simpler and less expensive cooling systems can be utilized.

Figure 2:
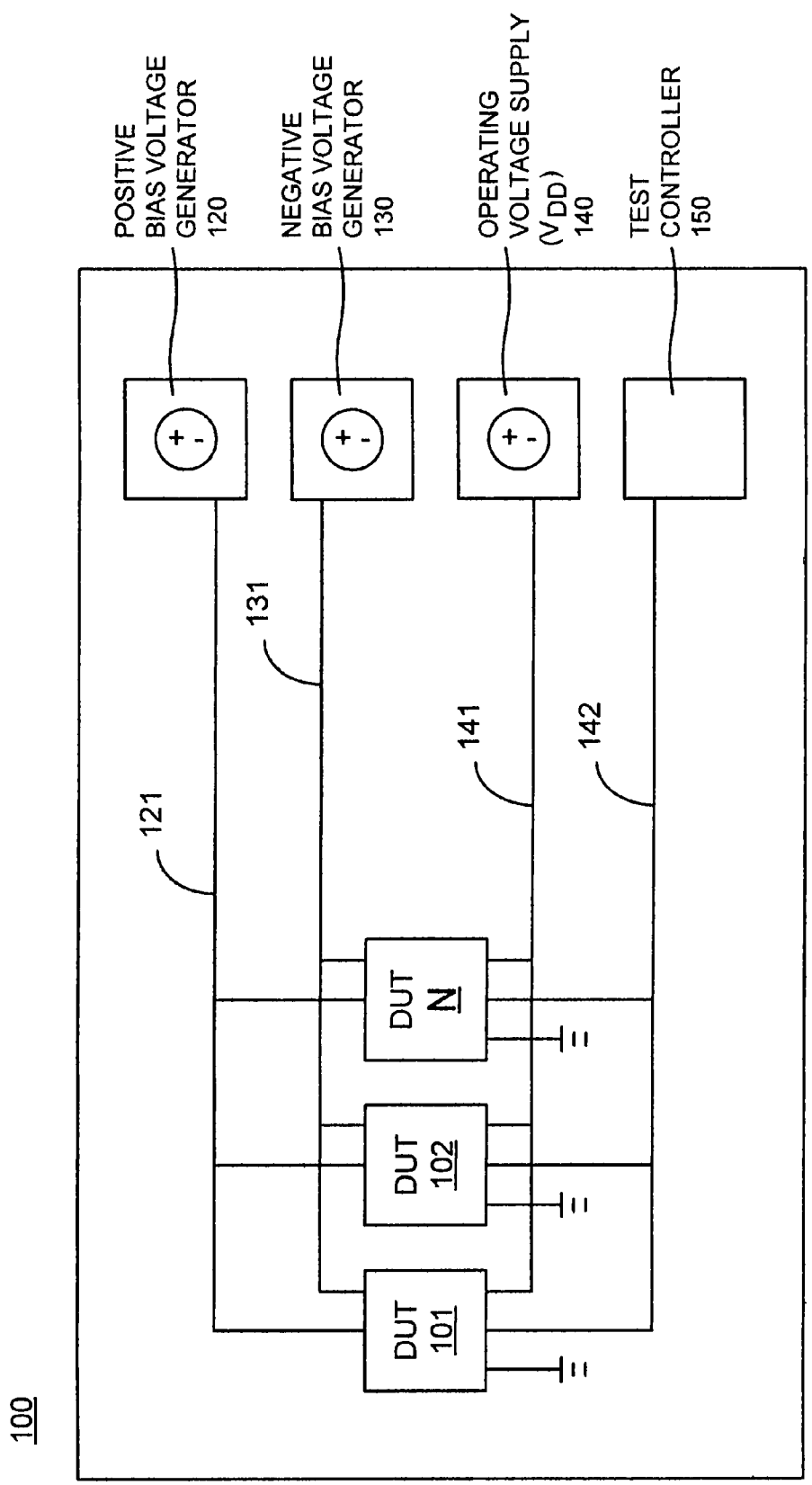
FIG. 2 illustrates an exemplary arrangement of integrated circuit devices configured for a burn-in testing, in accordance with one embodiment of the present invention.

FIG. 2 illustrates an exemplary apparatus 100 including a number of devices under test (e.g., integrated circuit devices) 101, 102, . . . , N configured for a burn-in operation, in accordance with one embodiment of the present invention. In accordance with embodiments of the present invention, the integrated circuit devices 101, 102, . . . , N are exemplified by pFET 50 of FIG. 1. As noted above, the integrated circuit devices 101, 102, . . . , N may instead be nFETs.

The integrated circuits 101, 102, . . . , N of FIG. 2 may be arrayed on a printed wiring board 110, which may include sockets for accepting the integrated circuit devices 101, 102, . . . , N. Because it is desirable to operate the integrated circuit devices under test at an elevated temperature, wiring board 110 is typically placed in a temperature chamber capable of temperature regulation at test temperatures (e.g., 150 degrees Celsius). A typical burn-in test chamber may include a number of wiring boards.

Wiring board 110 includes, for example, wiring traces to conduct electrical signals between various power supplies, test controllers and/or instrumentation, and integrated circuit devices 101, 102, . . . , N under test. In the present embodiment, wiring board 110 includes an operating voltage supply distribution system 141 and a test control distribution system 142. It is appreciated that the distribution systems 141 and 142 can be configured using bus, point-to-point, individual topologies, or the like.

Test control distribution system 142 couples test controller 150 and the integrated circuit devices 101, 102, . . . , N under test, and delivers signals from the test controller 150 to the integrated circuit devices 101, 102, . . . , N under test. A test unit controller, which may or may not be apart of test controller 150, can be used to stimulate the integrated circuit devices 101, 102, . . . , N under test with a test pattern sequence and/or test commands and to access a result. Embodiments in accordance with the present invention are well-suited to a wide variety of test unit controllers and testing methods, including, for example, Joint Test Action Group (JTAG) boundary scan and array built-in self test (ABIST).

Operating voltage supply distribution system 141 couples operating voltage supply 140 and the integrated circuit devices 101, 102, . . . , N under test. Operating voltage supply 140 provides voltage (Vdd) and current to operate the integrated circuit devices 101, 102, . . . , N under test.

Positive body bias voltage generator 120 is coupled to positive bias voltage distribution system 121, which in turn is coupled to the integrated circuit devices 101, 102, . . . , N under test. Positive body bias voltage generator 120 provides a positive body biasing voltage to n-type wells disposed beneath pFET devices in the integrated circuit devices 101, 102, . . . , N under test. Such body biasing enables adjustment of threshold voltages of the pFET devices, for example, to reduce leakage current of the pFET devices. In one embodiment, the body bias voltage provided by generator 120 is in the range of approximately zero to five volts.

In a similar manner, negative body bias voltage generator 130 is coupled to negative bias voltage distribution system 131, which in turn is coupled to the integrated circuit devices 101, 102, . . . , N under test. Negative body bias voltage generator 130 provides a negative body biasing voltage to p-type wells disposed beneath nFET devices in the integrated circuit devices 101, 102, . . . , N under test. Such body biasing enables adjustment of threshold voltages of the nFET devices, for example, to reduce leakage current of the nFET devices. In one embodiment, the body bias voltage provided by generator 130 is in the range of approximately zero to minus ten volts.

It is appreciated that the body bias voltage distribution systems 121 and 131 can be configured using bus, point-to-point, individual topologies or the like. There may be a plurality of body bias generators 120, 130 on wiring board 110, or bias generators 120, 130 may be located off of wiring board 110, in accordance with embodiments of the present invention.

In general, body bias voltage generators 120 and 130 are variable voltage sources. Their output voltage can be set (within a range) to a specific value. It is desirable, but not required, that such specific values be set digitally (e.g., by a command from test controller 150). Body biasing currents are typically on the order of low micro-amps per integrated circuit. Consequently, body bias voltage generators 120 and 130 can be relatively small and inexpensive voltage sources.

Figure 3:
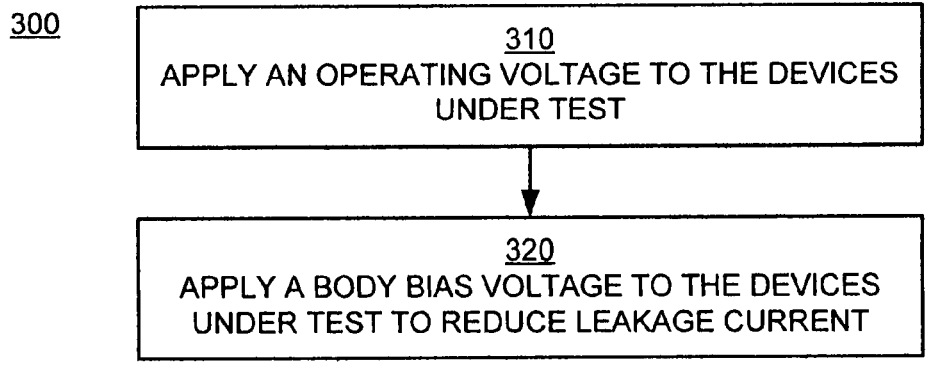
FIG. 3 is a flowchart of a method for burn-in testing in accordance with one embodiment of the present invention.
Figure 4:
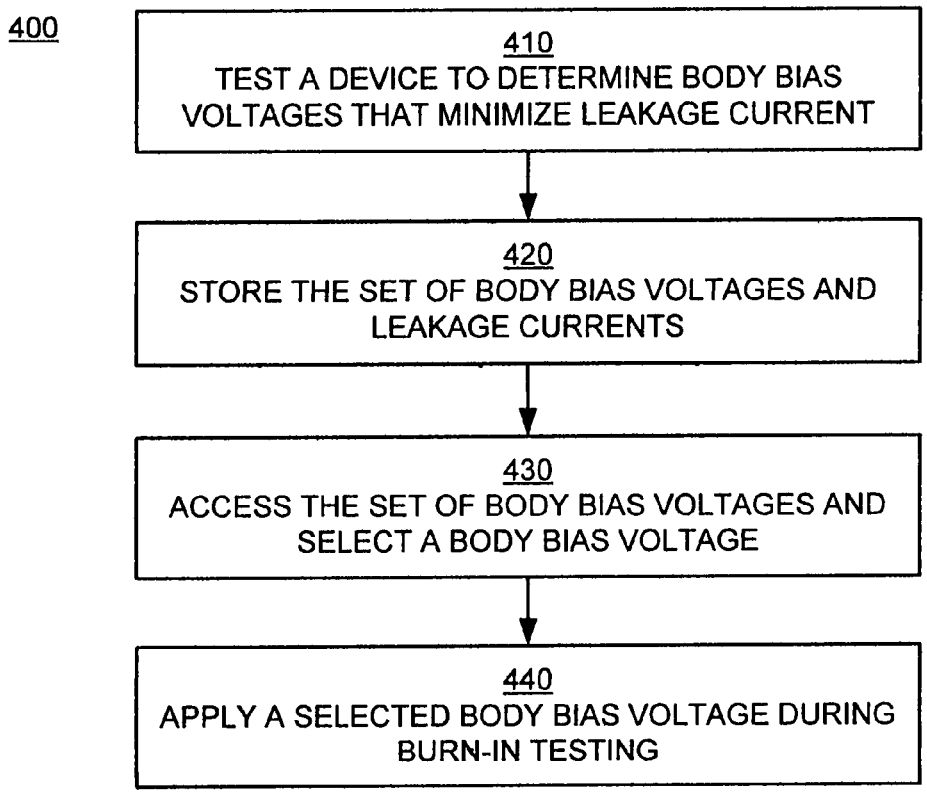
FIG. 4 is a flowchart of a method for selecting a body bias voltage for burn-in testing in accordance with one embodiment of the present invention.

FIG. 3 is a flowchart 300 of a method for burn-in testing in accordance with one embodiment of the present invention. FIG. 4 illustrates a flowchart 400 of a method for selecting a body bias voltage for burn-in testing in accordance with one embodiment of the present invention. Although specific steps are disclosed in flowcharts 300 and 400, such steps are exemplary. That is, the present invention is well suited to performing various other steps or variations of the steps recited in flowcharts 300 and 400. It is appreciated that the steps in flowcharts 300 and 400 may be performed in an order different than presented.

In block 310 of FIG. 3, an operating voltage is applied to the devices under test.

In block 320, a body bias voltage is applied to the devices under test. Application of the body bias voltage reduces leakage current associated with the devices under test. In one embodiment, the body bias voltage is selected to achieve a desired junction temperature at the devices under test.

In one embodiment, the devices under test include positive-channel metal-oxide semiconductor (PMOS) devices, and the body bias voltage is in the range of approximately zero to five volts.

In another embodiment, the devices under test include negative-channel metal-oxide semiconductor (NMOS) devices, and the body bias voltage is in the range of approximately zero to minus ten volts.

In block 410 of FIG. 4, an integrated circuit device is tested to determine a set of body bias voltages that substantially minimize leakage current. In general, the testing will determine a unique n-well voltage and a unique p-well voltage for the integrated circuit device. It is appreciated that integrated circuits with a variety of power domains and body biasing wells are well suited to use with the various embodiments in accordance with the present invention.

Advantageously, semiconductor packaging does not affect leakage current; therefore, leakage current may be accurately measured on a non-packaged device (e.g., on a wafer tester). As a beneficial consequence, in general, no additional special test equipment or fixtures are required to perform block 410 within a typical semiconductor manufacturing process. Body bias voltages that minimize leakage current will generally be determined outside of a burn-in process, for example during wafer testing. A set of body bias voltages that substantially minimize leakage current may be determined for an entire batch of integrated circuits, e.g., for a wafer or for multiple wafers processes at the same time. Alternatively, body bias voltages that substantially minimize leakage current can be determined for individual integrated circuits.

In block 420, in one embodiment, information pertaining to the set of body bias voltages is stored in a computer usable media. For instance, numerical representations of the voltages can be stored.

In block 430, in one embodiment, information pertaining to the set of body bias voltages is accessed and a body bias voltage is selected. In accordance with embodiments of the present invention, the computer usable media of block 420 may differ from the computer usable media of block 430.

In block 440, the body bias voltages selected in block 430 is applied to an integrated circuit during burn-in testing.

In summary, embodiments of the present invention provide systems and methods for reducing heat dissipation during burn-in. This provides a number of advantages, as follows.

The current capacity of the operating supply voltage (e.g., operating voltage supply 140 of FIG. 2) that operates the integrated circuit devices under test can be reduced. With less leakage current, operating supply voltage 140 does not have to supply as much current to operate the integrated circuit devices 101, 102, . . . , N under test. As a typical burn-in configuration can include perhaps hundreds of devices under test per wiring board, and as there may be multiples of such wiring boards, the reduction in current and power requirements can be significant. Accordingly, less expensive power supplies can be used for testing, and less power is consumed during testing. Alternatively, greater numbers of integrated circuits can be burned in with existing equipment, thereby increasing throughput of a burn-in process.

Also, by controlling body bias voltages to minimize leakage current and thereby reduce the amount of heat dissipated by the integrated circuits under test, less expensive thermal chambers may be utilized to perform burn-in testing. Expensive heat sinks and cooling systems can be avoided.

These advantages become more noticeable as semiconductor process geometries are reduced. For example, static power consumption in contemporary semiconductor processes, e.g., processes with a minimum feature size of about 0.13 microns and smaller, is no longer a negligible component of total power consumption. Further, static power, as a percentage of total power, is tending to increase with successive generations of semiconductor process. As process geometry shrinks, supply voltage (Vdd) typically is also decreased in order to avoid deleterious effects such as oxide breakdown. Consequently, threshold voltage should also be decreased in order to maintain or increase a desirable maximum operating frequency. Correspondingly, gate oxides are made thinner so that a gate can maintain control of the channel. A thinner gate oxide leads to an increased gate capacitance.

Because "off" or leakage current of a semiconductor device is generally proportional to gate capacitance, the trend to make gate oxides thinner tends to increase leakage current. As an unfortunate result, the on-going decrease in semiconductor process size also leads to an ever-increasing power consumption deriving from static power dissipation. Further, very much of the electrical energy provided by operating voltage supply 140 is converted into heat by the integrated circuit devices under test. Thus, reduced geometry devices can produce and dissipate more heat during burn-in testing. Controlling body bias voltages to minimize leakage current and reduce the amount of heat dissipated by the integrated circuits under test is therefore particularly advantageous for burn-in testing of reduced geometry devices.

Embodiments in accordance with the present invention, system and method for reducing heat dissipation during burn-in, are thus described. While the present invention has been described in particular embodiments, it should be appreciated that the present invention should not be construed as limited by such embodiments, but rather construed according to the below claims.

What is claimed is:

1. An apparatus for burn-in testing comprising:
a first voltage supply that provides an operating voltage to a plurality of devices under test;
a test controller coupled to said first voltage supply, wherein said test controller accesses a store of information comprising leakage current as a function of body bias voltage and selects a body bias voltage that corresponds to a desired junction temperature at said devices under test; and a second voltage supply coupled to said test controller, wherein said second voltage supply provides said body bias voltage corresponding to said desired junction temperature to said plurality of devices under test during said burn-in testing.

2. The apparatus of claim 1 wherein said devices under test comprise positive-channel metal-oxide semiconductor (PMOS) devices.

3. The apparatus of claim 2 wherein said body bias voltage is in the range of approximately zero to five volts.

4. The apparatus of claim 1 wherein said devices under test comprise negative-channel metal-oxide semiconductor (NMOS) devices.

5. The apparatus of claim 4 wherein said body bias voltage is in the range of approximately zero to minus ten volts.

6. A method of burn-in testing of a plurality of devices under test, said method comprising:

applying an operating voltage to said devices under test; and applying a body bias voltage to said devices under test, wherein said body bias voltage is selected from information comprising leakage current indexed by body bias voltage values and wherein said body bias voltage is selected to achieve a desired junction temperature at said devices under test.

7. The method of claim 6 wherein said devices under test comprise positive-channel metal-oxide semiconductor (PMOS) devices.

8. The method of claim 7 wherein said body bias voltage is in the range of approximately zero to five volts.

9. The method of claim 6 wherein said devices under test comprise negative-channel metal-oxide semiconductor (NMOS) devices.

10. The method of claim 9 wherein said body bias voltage is in the range of approximately zero to minus ten volts.

* * * * *